United States Patent
Huang et al.

(10) Patent No.: US 11,249,580 B2
(45) Date of Patent: Feb. 15, 2022

(54) TOUCH DISPLAY PANEL, METHOD FOR DRIVING TOUCH DISPLAY PANEL, AND ELECTRONIC DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Weiyun Huang, Beijing (CN); Yue Long, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

(*) Notice: Subject to any disclaimer, the term of this patent is extended or adjusted under 35 U.S.C. 154(b) by 0 days.

(21) Appl. No.: 16/309,011

(22) PCT Filed: May 7, 2018

(86) PCT No.: PCT/CN2018/085854
§ 371 (c)(1),
(2) Date: Dec. 11, 2018

(87) PCT Pub. No.: WO2019/033798
PCT Pub. Date: Feb. 21, 2019

(65) Prior Publication Data
US 2019/0384445 A1    Dec. 19, 2019

(30) Foreign Application Priority Data
Aug. 14, 2017 (CN) .......................... 201710693774.0

(51) Int. Cl.
*G06F 3/041* (2006.01)
*G09G 3/325* (2016.01)
(Continued)

(52) U.S. Cl.
CPC .......... *G06F 3/0416* (2013.01); *G06F 3/0412* (2013.01); *G06F 3/0443* (2019.05);
(Continued)

(58) Field of Classification Search
None
See application file for complete search history.

(56) References Cited

U.S. PATENT DOCUMENTS

| | | | |
|---|---|---|---|
| 6,376,994 B1 | 4/2002 | Ochi et al. | |
| 9,965,097 B2 * | 5/2018 | Yang | .......... G06F 3/0418 |

(Continued)

FOREIGN PATENT DOCUMENTS

| | | |
|---|---|---|
| CN | 104835454 A | 8/2015 |
| CN | 104898887 A | 9/2015 |

(Continued)

OTHER PUBLICATIONS

International Search Report and Written Opinion dated Jul. 24, 2018, PCT/CN2018/085854.

(Continued)

*Primary Examiner* — Benjamin X Casarez

(57) ABSTRACT

A touch display panel, a method for driving a touch display panel, and an electronic device are provided. The touch display panel includes a plurality of touch detection lines, a plurality of touch electrodes, a plurality of pixel units, and an insulating layer. The plurality of touch electrodes are in one-to-one correspondence with the plurality of touch detection lines, each of the plurality of pixel units includes a light emitting device, and the plurality of touch electrodes are configured to implement a touch function during a touch phase; and each of the plurality of touch electrodes is further configured to function as a cathode or an anode of the light emitting device to implement a display function during a display phase.

13 Claims, 9 Drawing Sheets

(51) Int. Cl.
*G09G 3/3283* (2016.01)
*G06F 3/044* (2006.01)

(52) U.S. Cl.
CPC ........... *G09G 3/325* (2013.01); *G09G 3/3283* (2013.01); *G06F 2203/04103* (2013.01); *G09G 2320/0295* (2013.01)

(56) References Cited

U.S. PATENT DOCUMENTS

| | | | |
|---|---|---|---|
| 10,031,629 B2 | 7/2018 | Wu | |
| 10,139,958 B2 | 11/2018 | Ding et al. | |
| 10,572,042 B2* | 2/2020 | Li | G06F 3/0416 |
| 10,818,733 B2 | 10/2020 | Yang et al. | |
| 2002/0101172 A1* | 8/2002 | Bu | G09G 3/3233 |
| | | | 315/169.3 |
| 2002/0125831 A1* | 9/2002 | Inukai | G09G 3/3233 |
| | | | 315/169.3 |
| 2004/0108518 A1* | 6/2004 | Jo | G09G 3/006 |
| | | | 257/200 |
| 2014/0225838 A1* | 8/2014 | Gupta | G09G 3/3208 |
| | | | 345/173 |
| 2014/0253502 A1* | 9/2014 | Cho | G06F 3/0412 |
| | | | 345/174 |
| 2016/0195997 A1* | 7/2016 | Lee | G06F 3/044 |
| | | | 345/174 |
| 2016/0349899 A1 | 12/2016 | Hwang et al. | |
| 2017/0047017 A1* | 2/2017 | Shirouzu | G09G 3/3291 |
| 2017/0147121 A1* | 5/2017 | Yang | G06F 3/044 |
| 2017/0153759 A1* | 6/2017 | Ding | G09G 3/32 |
| 2017/0177139 A1 | 6/2017 | Yang et al. | |
| 2017/0220150 A1* | 8/2017 | Wu | H01L 51/5225 |
| 2018/0151113 A1* | 5/2018 | Moon | G09G 3/3233 |
| 2018/0181242 A1* | 6/2018 | Mizuhashi | G06F 3/0416 |
| 2018/0239488 A1* | 8/2018 | Lin | G06F 3/0416 |
| 2018/0277037 A1* | 9/2018 | Lin | G06F 3/044 |
| 2018/0335881 A1* | 11/2018 | Lin | G06F 3/044 |
| 2019/0042034 A1* | 2/2019 | Chen | G06F 3/0412 |
| 2019/0278407 A1* | 9/2019 | Ma | G06F 3/042 |
| 2020/0035756 A1 | 1/2020 | Yang et al. | |

FOREIGN PATENT DOCUMENTS

| | | |
|---|---|---|
| CN | 105552106 A | 5/2016 |
| CN | 105702205 A | 6/2016 |
| CN | 106354339 A | 1/2017 |
| CN | 106384739 A | 2/2017 |

OTHER PUBLICATIONS

The First Chinese Office Action dated Dec. 4, 2019; Appln. No. 201710693774.0.
Extended European Search Report dated Apr. 9, 2021; Appln. No. 18810873.2.

* cited by examiner

TOUCH DISPLAY PANEL, METHOD FOR DRIVING TOUCH DISPLAY PANEL, AND ELECTRONIC DEVICE

The application claims priority to Chinese patent application No. 201710693774.0, filed on Aug. 14, 2017, the entire disclosure of which is incorporated herein by reference as part of the present application.

TECHNICAL FIELD

Embodiments of the present disclosure relate to a touch display panel, a method for driving a touch display panel, and an electronic device.

BACKGROUND

In the field of display, organic light emitting diode (OLED) display panels have characteristics such as being self-emissive, high contrast ratio, low power consumption, wide viewing angle, fast response, being usable for flexible panels, wide range of operating temperature, simple manufacturing process and the like, and have broad development prospects. As a new-generation display mode, OLED display panels are widely used in electronic products such as mobile phones, computers, full-color TVs, digital video cameras, personal digital assistants and the like.

With the development of touch technologies, electronic devices with a touch function have gradually entered people's work and life, and OLED display panels having a touch function also become a research focus in the field of display. Currently, OLED display panels having a touch function mostly adopt an add-on touch technology (for example, glass substrate-glass substrate type (GG), glass-film-film type (GFF) and the like) to implement the touch function. The add-on touch technology requires a touch layer to be separately formed on the display panel, the process is complicated, and the cost is high. On the other hand, when the add-on touch technology is applied to curved-surface display panels, the touch function has a high risk of failure since the curved-surface display panels are required to ensure the flexibility performance of the backboard.

SUMMARY

At least one embodiment of the present disclosure provides a touch display panel, comprising a plurality of touch detection lines, a plurality of touch electrodes, a plurality of pixel units, and an insulating layer. The plurality of touch electrodes are in one-to-one correspondence with the plurality of touch detection lines, each of the plurality of pixel units comprises a light emitting device, and the plurality of touch electrodes are configured to implement a touch function during a touch phase; and each of the plurality of touch electrodes is further configured to function as a cathode or an anode of the light emitting device to implement a display function during a display phase.

At least one embodiment of the present disclosure further provides an electronic device, comprising the touch display panel described in any one of the above-mentioned embodiments.

At least one embodiment of the present disclosure further provides a method for driving the touch display panel described in any one of the above-mentioned embodiments, comprising: generating a control signal; controlling by the control signal the plurality of touch detection lines to respectively transmit electrode voltage signals to the plurality of touch electrodes to implement the display function, during the display phase; and controlling by the control signal the plurality of touch detection lines to respectively transmit touch driving signals to the plurality of touch electrodes, and respectively reading touch sense signals of the plurality of touch electrodes through the plurality of touch detection lines, so as to implement the touch function, during the touch phase.

At least one embodiment of the present disclosure provides a touch display panel, a method for driving a touch display panel, and an electronic device. The anode or the cathode of the light emitting device functions as a touch electrode, thereby integrating the touch electrode for implementing the touch function into the touch display panel. The touch-display-integration may be implemented by time division multiplexing without adding additional processes, the production cost is reduced, the volume and weight of the display panel are reduced, and the added value of the product is improved.

BRIEF DESCRIPTION OF THE DRAWINGS

In order to clearly illustrate the technical solutions of the embodiments of the disclosure, the drawings of the embodiments will be briefly described in the following. It is evident that the described drawings are only related to some embodiments of the disclosure and thus are not limitative of the disclosure.

DETAILED DESCRIPTION

Figure 1A:
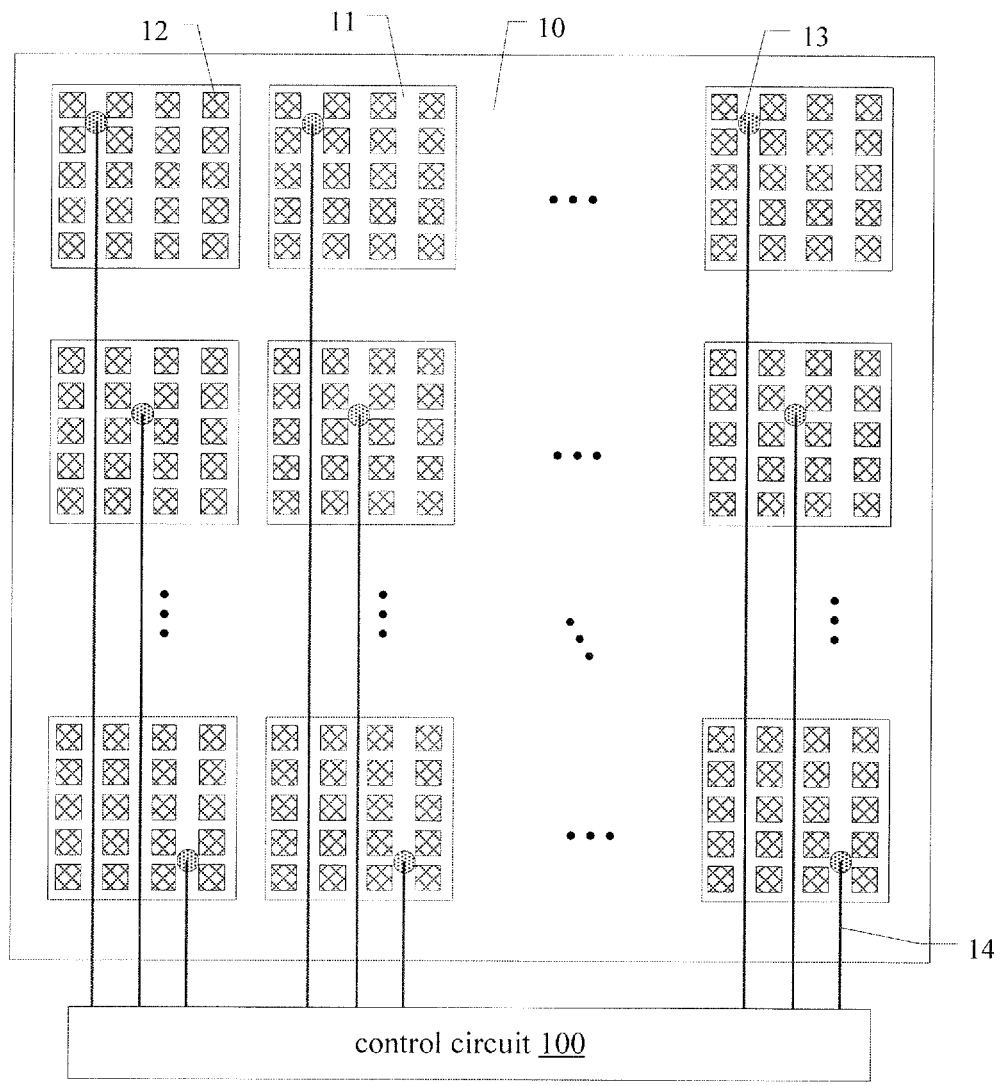
FIG. 1A is a schematic plan diagram of a touch display panel provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

With the continuous development of touch technologies, touch technologies are increasingly used in electronic products such as mobile phones, tablet computers, notebook computers and the like. Touch technologies may comprise capacitive touch technology, electromagnetic touch technology, resistive touch technology, optical touch technology and the like. Capacitive touch technology develops rapidly due to advantages such as low cost, wear resistance, long life, etc. Organic light emitting diode (OLED) display panels having a touch function may adopt the capacitive touch technology. OLED display panels based on the capacitive touch technology require two independent manufacturing processes, namely, add-on touch substrate manufacturing process and OLED display substrate manufacturing process. Therefore, the process flow and the product structure of OLED display panels having a touch function are complicated.

OLED display panels comprise a laminated structure of an anode, an organic light emitting layer, and a cathode, and may further comprise auxiliary functional layers such as a hole injection layer, a hole transport layer, an electron injection layer, an electron transport layer, etc., as required. OLED display panels may be divided into two types: passive matrix driving organic light emitting diode (PMOLED) display panels and active matrix driving organic light emitting diode (AMOLED) display panels, according to the driving mode. PMOLED display panels comprise a cathode and an anode, a portion where the anode and the cathode intersect can emit light, and the driving circuit may be externally packaged by connection methods such as a tape carrier package (TCP) method or a chip on glass (COG) method. Each pixel of AMOLED display panels is provided with thin film transistors (TFTs) having a switching function and a charge storage capacitor, whereby each pixel can be independently controlled, and peripheral driving circuit and the OLED can be integrated on the same glass substrate. For example, when AMOLED display panels are in operation, the OLED is driven to emit light by applying a voltage to both terminals of the OLED. For example, OLEDs of different sub-pixels emit light of different colors, thereby performing full-color display. AMOLED display panels have the advantages such as short response time, low power consumption, high contrast ratio, wide viewing angle, etc. The embodiments of the present disclosure are described in detail by taking AMOLED display panels as an example.

At least one embodiment of the present disclosure provides a touch display panel, which comprises a plurality of touch detection lines, a plurality of touch electrodes, a plurality of pixel units, and an insulating layer. The plurality of touch electrodes are in one-to-one correspondence with the plurality of touch detection lines, each of the plurality of touch electrodes is electrically coupled to a corresponding touch detection line of the plurality of touch detection lines through at least one connection hole in the insulating layer, each of the plurality of pixel units comprises a light emitting device, and the plurality of touch electrodes are configured to implement a touch function during a touch phase; and the plurality of touch electrodes are further configured to function as a cathode or an anode of the light emitting device to implement a display function during a display phase.

For example, according to the characteristics of transistors, transistors may be divided into two types: N-type transistors and P-type transistors. For the sake of clarity, in the embodiments of the present disclosure, the technical solutions of the present disclosure are described in detail by taking the case where a first transistor, a second transistor, and a third transistor are both P-type transistors (for example, P-type MOS transistors), and a fourth transistor is an N-type transistor (for example, N-type MOS transistor), as an example. However, the embodiments of the present disclosure are not limited thereto, and those skilled in the art may also implement particular configurations as required.

It should be noted that the transistors used in the embodiments of the present disclosure may be thin film transistors, field effect transistors or other switching devices with the same characteristics. Thin film transistors may comprise oxide thin film transistors, amorphous silicon thin film transistors, polysilicon thin film transistors, etc. The source electrode and the drain electrode of the transistor used here can be symmetrical in structure, so the source electrode and the drain electrode thereof can be indistinguishable in structure. In the embodiments of the present disclosure, in order to distinguish the electrodes of the transistors, except the gate electrode which is described as a control electrode, one of the two remaining electrodes is directly described as a first electrode, and the other is described as a second electrode. Therefore, the first electrode and the second electrode of all or part of the transistors in the embodiments of the present disclosure can be interchangeable as required. For example, for an N-type transistor, the first electrode of the transistor may be the source electrode and the second electrode may be the drain electrode; or, for a P-type transistor, the first electrode of the transistor may be a drain electrode and the second electrode may be the source electrode. For different types of transistors, levels of the control voltage of the gate electrode are also different. For example, for an N-type transistor, the N-type transistor is in an on-state when the control signal is at a high level, and the N-type transistor is in an off-state when the control signal is at a low level. For a P-type transistor, the P-type transistor is in an on-state when the control signal is at a low level, and the P-type transistor is in an off-state when the control signal is at a high level.

Several embodiments of the present disclosure are described in detail below with reference to the accompanying drawings, but the present disclosure is not limited to these specific embodiments.

Figure 1B:
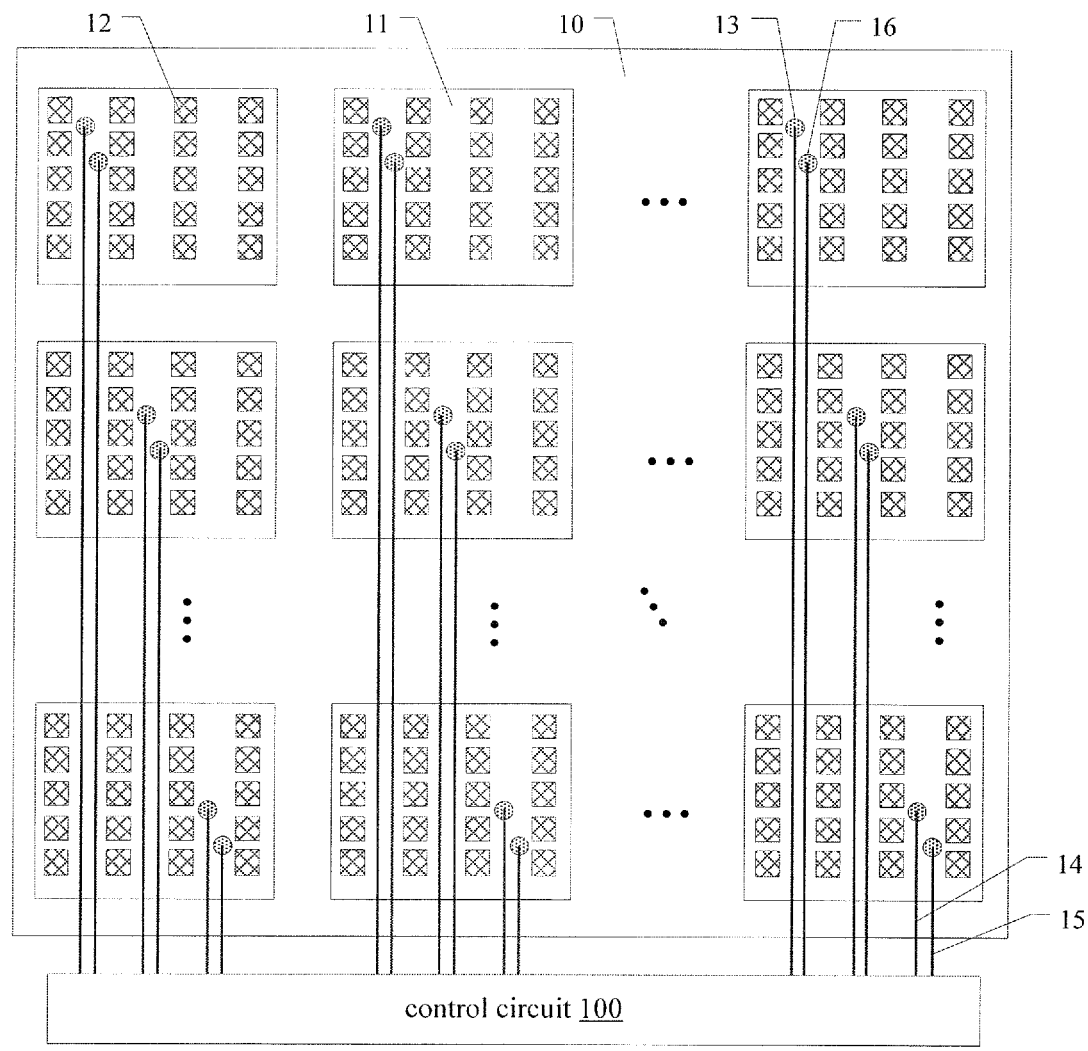
FIG. 1B is a schematic plan diagram of another touch display panel provided by at least one embodiment of the present disclosure.
Figure 2:
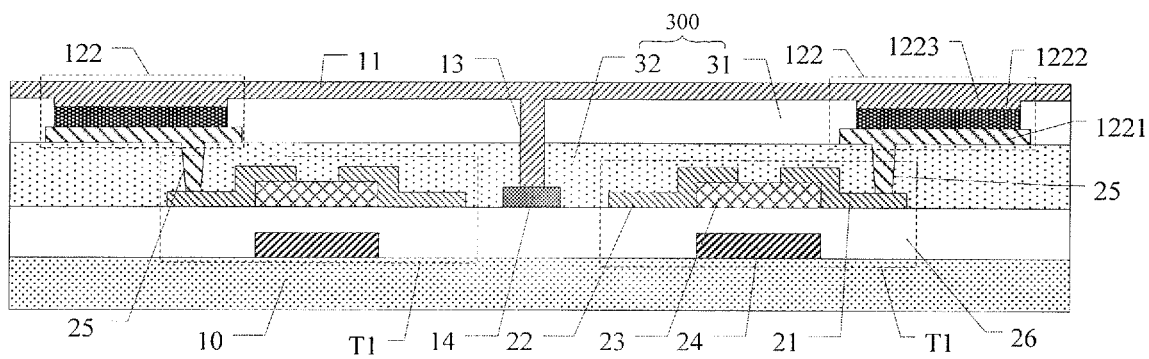
FIG. 2 is a sectional structural diagram of a touch display panel provided by at least one embodiment of the present disclosure.

FIG. 1A is a schematic plan diagram of a touch display panel provided by at least one embodiment of the present disclosure, FIG. 1B is a schematic plan diagram of another touch display panel provided by at least one embodiment of the present disclosure, and FIG. 2 is a sectional structural diagram of a touch display panel provided by at least one embodiment of the present disclosure.

For example, as illustrated in FIG. 1A and FIG. 2, a touch display panel provided by at least one embodiment of the present disclosure comprises a substrate 10, a plurality of touch detection lines 14, a plurality of touch electrodes 11, a plurality of pixel units 12, and an insulating layer 300. The plurality of touch detection lines 14, the plurality of touch electrodes 11 and the plurality of pixel units 12 are all on the substrate 10, and the plurality of touch electrodes 11 are in one-to-one correspondence with the plurality of touch detection lines 14. Each of the plurality of pixel units 12 comprises a light emitting device 122. The plurality of touch electrodes 11 are configured to implement a touch function during a touch phase; and the plurality of touch electrodes 11 are configured to function as a cathode or an anode of the light emitting device 122 to implement a display function during a display phase. For example, the plurality of touch electrodes 11 are configured to receive electrode voltage signals during the display phase, to implement the display function; and the plurality of touch electrodes 11 are further configured to receive touch driving signals during the touch phase, to implement the touch function.

For example, each of the plurality of touch electrodes 11 may function as the anode of the light emitting device 122 of one or more pixel units 12. Alternatively, each of the plurality of touch electrodes 11 may function as the cathode of the light emitting device 122 of one or more pixel units 12.

For example, the plurality of touch electrodes 11 are arranged on the substrate 10 in an array. These touch electrodes 11 form a self-capacitance electrode array, which can be used for touch detection. For example, each touch electrode 11 corresponds to a pixel unit group, and the pixel unit group comprises at least one pixel unit 12.

For example, the plurality of touch electrodes 11 have the same shape, so that the electrical characteristics of the plurality of touch electrodes 11 are substantially the same, thereby ensuring the accuracy of touch detection and the uniformity of displayed images. However, the embodiments of the present disclosure are not limited thereto, and the plurality of touch electrodes 11 may have different shapes.

For example, as illustrated in FIG. 1A, each touch electrode 11 may have a rectangular shape, for example, may be square. However, the embodiments of the present disclosure are not limited thereto, and the shape of the touch electrode 11 may be circular, trapezoid, etc., according to actual design requirements. The shape of the touch electrode 11 is not specifically limited in the embodiments of the present disclosure.

For example, the light emitting device 122 may be an organic light emitting diode (OLED). The light emitting device 122 is configured to receive a light emission signal (e.g., may be a current signal) while in operation and to emit light of an intensity corresponding to the light emission signal.

It should be noted that, in the embodiments of the present disclosure, the light emitting device 122 is described by taking an OLED as an example. However, the embodiments of the present disclosure are not limited thereto, and the light emitting device 122 may also be a quantum dot light emitting diode (QLED), the present disclosure has no limitation in this aspect.

For example, the light emitting device 122 may comprise an upward-light-emitting-type light emitting diode and a downward-light-emitting-type light emitting diode. The substrate 10, for example, comprises a first side provided with the light emitting device 122 and a second side away from the light emitting device 122. The light emitted by the downward-light-emitting-type light emitting diode transmits through the substrate 10 and emits out from the second side of the substrate 10, and the light emitted by the upward-light-emitting-type light emitting diode emits out from the first side of the substrate 10 without passing through the substrate 10. It should be noted that the light emitting device 122 may also be a double-sided-light-emitting-type light emitting diode.

For example, in a case where the light emitting device 122 is an upward-light-emitting-type light emitting diode, each touch electrode 11 functions as a cathode of the upward-light-emitting-type light emitting diode. In a case where the light emitting device 122 is a downward-light-emitting-type light emitting diode, each touch electrode 11 functions as an anode of the downward-light-emitting-type light emitting diode. In summary, the touch electrodes 11 may be on the light exiting side of the touch display panel, thereby preventing the anode or the cathode of the light emitting device 122 from shielding or interfering with the touch signals and ensuring the touch effect.

It should be noted that in a case where the light emitting device 122 is an upward-light-emitting-type light emitting diode, the anode of the light emitting device 122 functions as a pixel electrode, and is electrically coupled to a driving transistor (see the first transistor T1 in FIG. 2). In a case where the light emitting device 122 is a downward-light-emitting-type light emitting diode, the cathode of the light emitting device 122 functions as the pixel electrode, and is electrically coupled to the driving transistor (see the first transistor T1 in FIG. 2).

It should be noted that, in the present disclosure, all the touch electrodes 11 on the touch display panel function as the cathode or the anode of the light emitting device 122, but the embodiments of the present disclosure are not limited thereto, and only part of the touch electrodes 11 may function as the cathode or the anode of the light emitting device 122.

For example, as illustrated in FIG. 2, the light emitting device 122 may comprise a first electrode 1221, an organic layer 1222 and a second electrode 1223, and the organic layer 1222 is between the first electrode 1221 and the second electrode 1223. For example, the first electrode 1221 may be an anode or a cathode, and accordingly, the second electrode 1223 is a cathode or an anode. The touch electrode 11 may function as the second electrode 1223 of the light emitting device 122. That is to say, the touch electrode 11 which implements the touch function may be the anode or the cathode of the light emitting device 122, and the touch electrode 11 is integrated in the display panel. Touch-display-integration may be implemented by time division multiplexing without any additional process, the production cost is reduced, the volume and weight of the display panel is reduced, and the added value of the product is improved. Meanwhile, in a case where the touch display panel is a curved-surface display panel, the touch display panel may improve the stability of the flexible display.

For example, the organic layer 1222 may be a multilayer structure. The organic layer 1222 may comprise functional layers such as a hole injection layer, a hole transport layer, an organic light emitting layer, an electron transport layer, an electron injection layer. For another example, the organic layer 1222 may further comprise a hole blocking layer and an electron blocking layer, as required. The hole blocking layer may be, for example, between the electron transport layer and the light emitting layer, and the electron blocking layer may be, for example, between the hole transport layer and the light emitting layer. The arrangement and material of each layer in the organic layer 1222 may refer to a general design, and it is not limited in the embodiments of the present disclosure.

For example, the anode serves as a connection electrode for a forward voltage, which has a better conductivity and a higher work function value, and the cathode serves as a connection electrode for a negative voltage, which has a better conductivity and a lower work function value. In a case where the first electrode 1221 is the anode and the second electrode 1223 is the cathode, the first electrode 1221 may be formed by a transparent conductive material having a high work function, and the electrode material may comprise indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes, etc. The second electrode 1223 may be formed by a material of a high conductivity and a low work function, and the electrode material may comprise an alloy such as magnesium aluminum alloy (MgAl) or lithium aluminum alloy (LiAl), or a single metal such as magnesium, aluminum or lithium. It should be noted that both the first electrode 1221 and the second electrode 1223 may be formed by a transparent conductive material. It is not limited in the embodiments of the present disclosure.

For example, as illustrated in FIG. 2, in an example, the light emitting device 122 is an upward-light-emitting-type light emitting diode, the first electrode 1221 is the anode, and the second electrode 1223 is the cathode, so the second electrode 1223 is a translucent cathode, and the first electrode 1221 is a reflective electrode. The second electrode 1223 is formed by, for example, a transparent conductive material or a translucent metal material. The first electrode 1221 may be formed by, for example, one or more of highly reflective metal materials (for example, silver (Ag), aluminum (Al), etc.).

For example, in a case where the light emitting device 122 is a downward-light-emitting-type light emitting diode, the anode of the light emitting device 122 may be formed by a transparent conductive material (for example, ITO or the like), and the cathode of the light emitting device 122 may be formed by a metal material.

For example, the light emitting devices 122 in different pixel units 12 may emit light of different colors, for example, may emit red light, green light, blue light, white light, etc., thereby implementing color display. For example, the light emitting layer in the organic layer 1222 may adopt different luminescent materials to implement emission of light of different colors.

For example, the touch electrode 11 functions as the second electrode 1223, so that the touch electrode 11 can be manufactured by the same material as the second electrode 1223.

For example, as illustrated in FIG. 2, the insulating layer 300 may comprise a flat layer 32 and a pixel definition layer 31. Each touch electrode 11 is electrically coupled to the corresponding touch detection line 14 through at least one connection hole in the insulating layer 300. The insulating layer 300 covers the plurality of touch detection lines 14, and the plurality of touch electrodes 11 are on the insulating layer 300. For example, the flat layer 32 covers the touch detection lines 14, the pixel definition layer 31 is on the flat layer 32, and the touch electrodes 11 is on the pixel definition layer 31. There are a plurality of first connection holes 13 in the insulating layer 300. The first connection holes 13 penetrate the pixel definition layer 31 and the flat layer 32 to expose the touch detection lines 14. The touch electrodes 11 are electrically coupled to the touch detection lines 14 through the first connection holes 13.

For example, each touch electrode 11 may correspond to one first connection hole 13 or a plurality of first connection holes 13. The plurality of first connection holes 13 can reduce the contact resistance between the touch electrode 11 and the touch detection line 14.

For example, the pixel definition layer 31 is configured to define sub-pixel regions, and the light emitting layer in the organic layer 1222 is correspondingly disposed in opening regions of the pixel definition layer 31. The pixel definition layer 31 may be a one-layer or two-layer structure, and may also be a multi-layer composite layer structure. It is not limited in the embodiments of the present disclosure.

For example, the pixel definition layer 31 may be manufactured by an insulation material, for example, may be manufactured by an organic insulation material.

For example, examples of the material of the flat layer 32 comprise silicon nitride ($SiN_x$), silicon oxide ($SiO_x$), silicon oxynitride ($SiN_xO_y$), or other suitable materials.

For example, the substrate 10 may be a transparent insulating substrate, and the transparent insulating substrate may be, for example, a glass substrate, a quartz substrate, or other suitable substrate.

It should be noted that the materials of the above layers are schematically listed, and the material of each layer is not limited in the embodiments of the present disclosure.

Figure 3A:
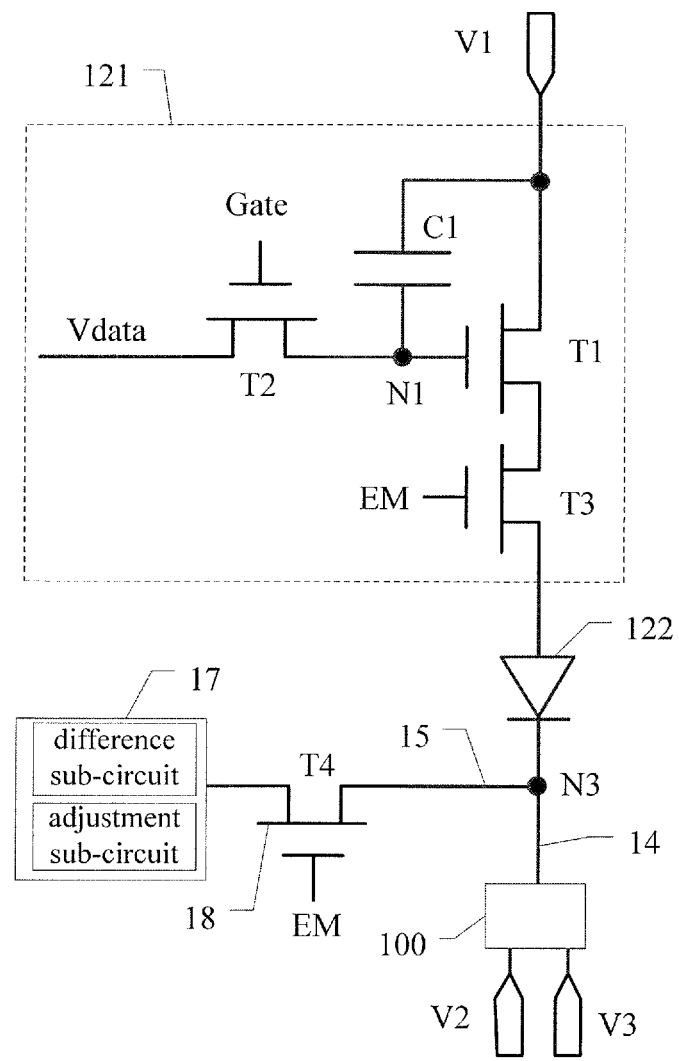
FIG. 3A is a schematic circuit diagram of a first type of a pixel unit provided by at least one embodiment of the present disclosure.
Figure 3B:
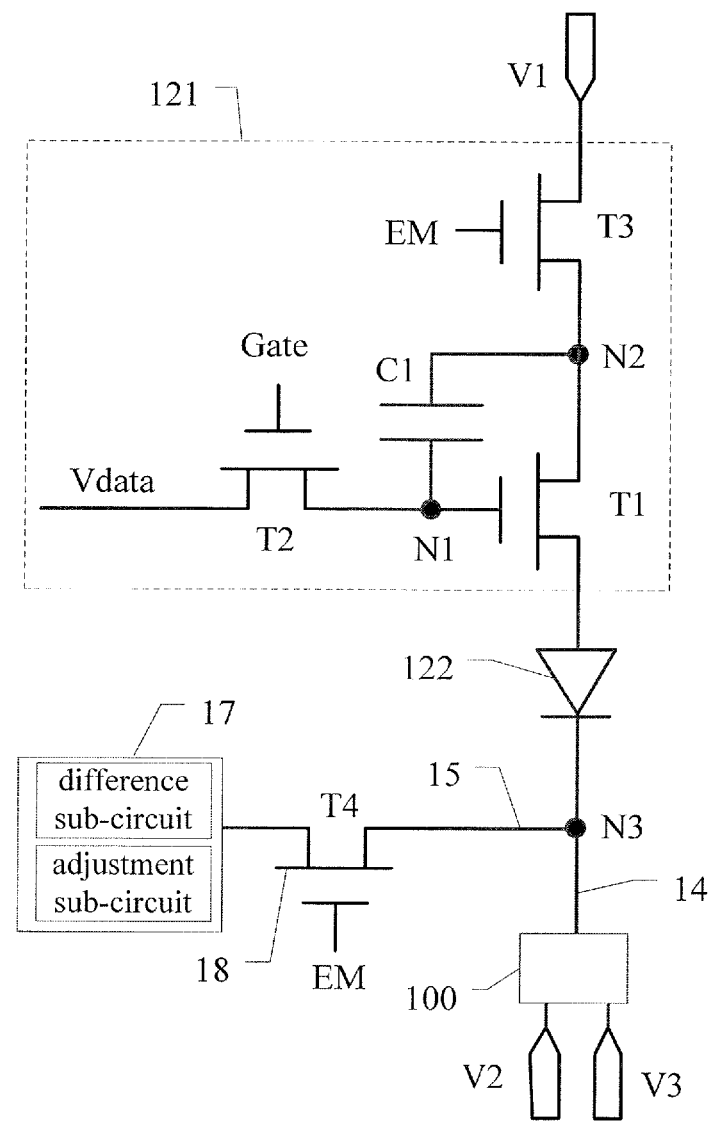
FIG. 3B is a schematic circuit diagram of a second type of a pixel unit provided by at least one embodiment of the present disclosure.
Figure 4A:
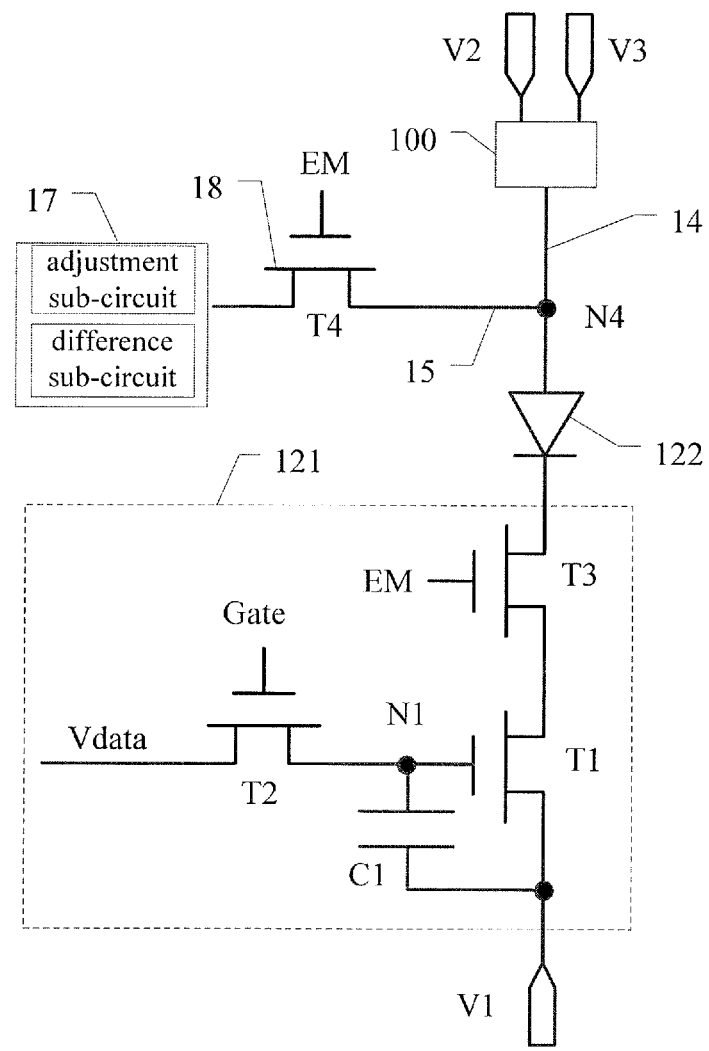
FIG. 4A is a schematic circuit diagram of a third type of a pixel unit provided by at least one embodiment of the present disclosure.
Figure 4B:
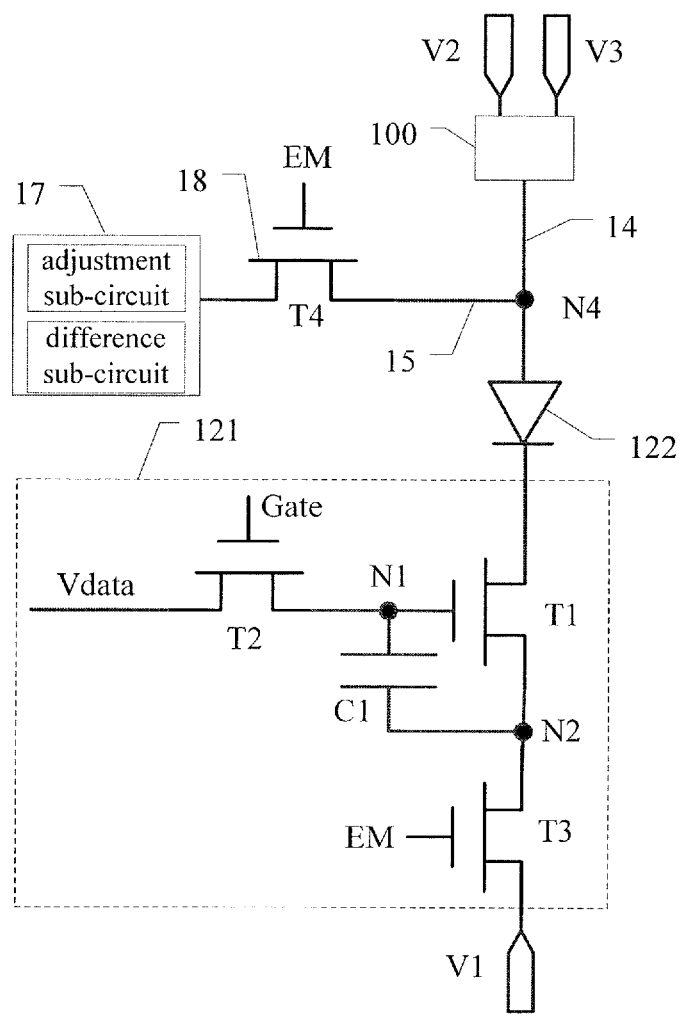
FIG. 4B is a schematic circuit diagram of a fourth type of a pixel unit provided by at least one embodiment of the present disclosure.

FIG. 3A is a schematic circuit diagram of a first type of a pixel unit provided by at least one embodiment of the present disclosure; FIG. 3B is a schematic circuit diagram of a second type of a pixel unit provided by at least one embodiment of the present disclosure; FIG. 4A is a schematic circuit diagram of a third type of a pixel unit provided by at least one embodiment of the present disclosure; and FIG. 4B is a schematic circuit diagram of a fourth type of a pixel unit provided by at least one embodiment of the present disclosure.

For example, as illustrated in FIG. 2 and FIG. 3A, the touch display panel provided by the embodiments of the present disclosure adopts an active driving mode, and the pixel unit 12 further comprises a driving circuit 121, which is configured to drive the light emitting device 122 to emit light during the display phase.

For example, the driving circuit 121 comprises a first transistor T1 and a second transistor T2. The first transistor T1 may be called as a driving transistor and the second transistor T2 may be called as a selection transistor. For example, the touch detection line 14 is in the same layer as a gate electrode, a source electrode or a drain electrode of the first transistor T1, and/or the touch detection line 14 is in the same layer as a gate electrode, a source electrode or a drain electrode of the second transistor T2, so as to form the touch detection line 14 and the gate electrode, the source electrode or the drain electrode in a single patterning process.

For example, as illustrated in FIG. 2, in a specific example, the first transistor T1 adopts a bottom-gate-type structure, and the first transistor T1 comprises a gate electrode 24, a gate insulating layer 26, an active layer 23, a first electrode 21 (for example, may be the drain electrode) and a second electrode 22 (for example, may be the source electrode) which are sequentially disposed on the substrate 10. The flat layer 32 is provided with a via hole 25, the via hole 25 exposes the first electrode 21, and the first electrode 1221 of the light emitting device 122 is electrically coupled to the first electrode 21 through the via hole 25. The touch detection line 14 is in the same layer as the first electrode 21 and the second electrode 22 of the first transistor T1. For example, the touch detection line 14 can be formed simultaneously with the first electrode 21 and the second electrode 22 by a single patterning process, thereby reducing the process steps and saving the production costs.

It should be noted that materials of the gate electrode 24, the gate insulating layer 26, the active layer 23, the first electrode 21, and the second electrode 22 may refer to a general design. The first transistor T1 and the second transistor T2 may adopt a bottom-gate-type structure or a top-gate-type structure, which is not limited in the embodiments of the present disclosure.

For example, the extending direction of the touch detection lines 14 may be the same as the extending direction of data lines (not illustrated). However, the embodiments of the present disclosure are not limited thereto, and the extending direction of the touch detection lines 14 may be the same as the extending direction of gate lines (not illustrated).

For example, the touch detection lines 14 may also be formed in a same layer as the data lines and/or the gate lines, thereby simplifying the manufacturing process of the touch display panel and facilitating wiring.

For example, as illustrated in FIGS. 3A-4B, the touch display panel further comprises a first power supply terminal V1 and a second power supply terminal V2. For example, the touch detection lines 14 may be electrically coupled to the second power supply terminal V2. During the display phase, the second power supply terminal V2 is configured to output electrode voltage signals, and the electrode voltage signals may be transmitted to the plurality of touch electrodes 11 through the plurality of touch detection lines 14, respectively.

For example, as illustrated in FIG. 3A and FIG. 3B, in some examples, the first power supply terminal V1 is a high voltage terminal and the second power supply terminal V2 is a low voltage terminal, and the touch electrode 11 may function as the cathode of the light emitting device 122. During the display phase, the electrode voltage signal is a low level signal (for example, 0V), and the electrode voltage signal may be transmitted to the touch electrode 11, that is, the cathode of the light emitting device 122, through the touch detection line 14.

For example, as illustrated in FIG. 4A and FIG. 4B, in other examples, the first power supply terminal V1 is a low voltage terminal and the second power supply terminal V2 is a high voltage terminal, and the touch electrode 11 may function as the anode of the light emitting device 122. During the display phase, the electrode voltage signal is a high level signal (for example, 5V), and the electrode voltage signal can be transmitted to the touch electrode 11, that is, the anode of the light emitting device 122, through the touch detection line 14.

For example, the high voltage terminal may be electrically coupled to an anode of a power supply to output a positive voltage. The low voltage terminal may be electrically coupled to a cathode of a power supply to output a negative voltage. The low voltage terminal may also be electrically coupled to the ground.

For example, the touch display panel further comprises a touch power supply terminal V3, and the touch power supply terminal V3 is electrically coupled to the touch detection lines 14. During the touch phase, the touch power supply terminal V3 is configured to output touch driving signals, and the touch driving signals are transmitted to the touch electrodes 11 through the touch detection lines 14.

For example, the touch driving signals may be pulse voltage signals.

For example, as illustrated in FIG. 1A, the touch display panel further comprises a control circuit 100. During the display phase, the control circuit 100 is configured to control the plurality of touch detection lines 14 to respectively transmit the electrode voltage signals to the plurality of touch electrodes 11. During the touch phase, the control circuit 100 is configured to control the plurality of touch detection lines 14 to respectively transmit the touch driving signals to the plurality of touch electrodes 11. The control circuit 100 may drive the touch electrode 11 in a time-sharing manner. For example, during the display phase, the touch electrode 11 functions as the anode or the cathode of the light emitting device 122. During the touch phase, the touch electrode 11 may be used to sense the touch signal. The touch display panel provided by the embodiments of the present disclosure can implement touch-display-integration.

For example, the control circuit 100 may comprise a signal generation sub-circuit and a selection sub-circuit. The signal generation sub-circuit is configured to generate and output a control signal EM; and the selection sub-circuit is configured to control the plurality of touch detection lines 14 to transmit different signals (i.e., the electrode voltage signals and the touch driving signals) to the touch electrodes 11 according to the control signal EM. For example, in a case where the control signal EM has a first polarity, the plurality of touch detection lines 14 respectively transmit the electrode voltage signals to the plurality of touch electrodes 11, and in a case where the control signal EM has a second polarity, the plurality of touch detection lines 14 respectively transmit the touch driving signals to the plurality of touch electrodes 11.

For example, the first polarity is a positive polarity and the second polarity is a negative polarity, or the first polarity is the negative polarity and the second polarity is the positive polarity.

Figure 5:
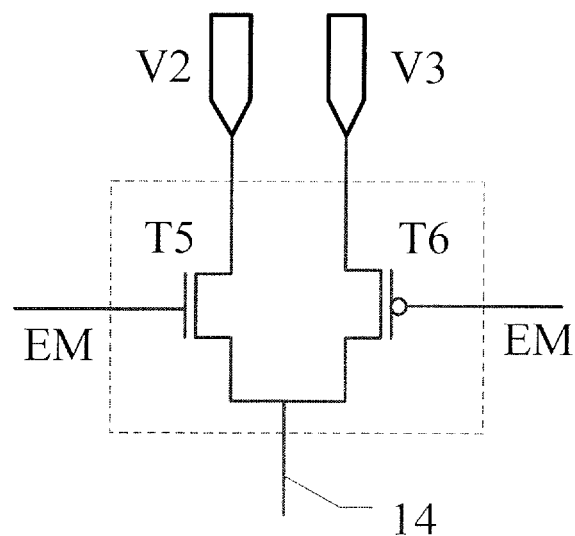
FIG. 5 is a structural schematic diagram of a selection sub-circuit of a control circuit provided by at least one embodiment of the present disclosure.

FIG. 5 is a structural schematic diagram of a selection sub-circuit in a control circuit provided by at least embodiment of the present disclosure.

For example, as illustrated in FIG. 5, in a specific example, the selection sub-circuit may comprise a fifth transistor T5 and a sixth transistor T6. A gate electrode of the fifth transistor T5 and a gate electrode of the sixth transistor T6 both receive the control signal EM, a second electrode of the fifth transistor T5 and a second electrode of the sixth transistor T6 are electrically coupled to the touch detection line 14, a first electrode of the fifth transistor T5 is electrically coupled to the second power supply terminal V2, and a first electrode of the sixth transistor T6 is electrically coupled to the touch power supply terminal V3, so that the fifth transistor T5 may transmit the electrode voltage signal output by the second power supply terminal V2 to the touch detection line 14, while the sixth transistor T6 may transmit the touch driving signal output by the touch power supply terminal V3 to the touch detection line 14.

For example, the fifth transistor T5 and the sixth transistor T6 are of opposite types, so that under the control of the same control signal EM, one of the transistors is turned on and the other transistor is turned off. For example, in a case where the fifth transistor T5 is an N-type transistor, the sixth transistor T6 is a P-type transistor; or, in a case where the fifth transistor T5 is a P-type transistor, the sixth transistor T6 is an N-type transistor.

The pixel unit provided by the embodiments of the present disclosure is described in detail below with reference to FIGS. 3A-4B.

For example, as illustrated in FIGS. 3A-4B, in addition to the first transistor T1 and the second transistor T2, the driving circuit 121 may further comprise a third transistor T3 and a storage capacitor C1, that is, three thin film transistors (TFTs) and one storage capacitor are used to implement the basic function of driving the light emitting device 122 to emit light. That is to say, the driving circuit 121 adopts a 3T1C structure, and the third transistor T3 is added on the basis of the conventional 2T1C structure.

For example, the touch detection line 14 may also be in the same layer as a gate electrode, a source electrode or a drain electrode of the third transistor T3.

For example, the first transistor T1 is configured to transmit a light emission signal corresponding to a display data signal Vdata to the light emitting device 122, thereby driving the light emitting device 122 to emit light. The light emission signal may be, for example, a current signal. The second transistor T2 is configured to write the display data signal Vdata to the gate electrode of the first transistor T1 to control the magnitude of the current signal flowing through the first transistor T1, when the second transistor T2 is turned on. The storage capacitor C1 is configured to store the display data signal Vdata and hold it at the gate electrode of the first transistor T1. The display data signal Vdata may control the conduction extent of the first transistor T1, thereby controlling the magnitude of the current signal flowing through the first transistor T1. The current signal flowing through the first transistor T1 may be transmitted to the light emitting device 122 to drive the light emitting device 122 to emit light, and the current signal may determine the gray level (i.e., the luminous intensity) of the light emitted by the light emitting device 122. The third transistor T3 may be called as a light emission control transistor. During the display phase, the third transistor T3 is configured to connect the first transistor T1 to the light emitting device 122, thereby driving the light emitting device 122 to emit light; and during the touch phase, the third transistor T3 is configured to suspend one side of the first transistor T1, so the first transistor T1 cannot drive the light emitting device 122 to emit light, thus the third transistor T3 may avoid mutual interference between the display function and the touch function of the touch display panel.

For example, FIG. 3A is a circuit diagram of a first type of a pixel unit. In the example illustrated in FIG. 3A, a first electrode of the third transistor T3 is electrically coupled to the first transistor T1, a second electrode of the third transistor T3 is electrically coupled to the light emitting device 122, and the third transistor T3 is configured to control the light emitting device 122 to be coupled to or decoupled from the first transistor T1. During the display phase, the third transistor T3 is configured to connect the light emitting device 122 to the first transistor T1, to control the light emitting device 122 to emit light, so that the touch display panel implements the display function. During the touch phase, the third transistor T3 is configured to disconnect the light emitting device 122 from the first transistor T1, so that the touch display panel implements the touch function.

For example, in the example illustrated in FIG. 3A, a gate electrode of the second transistor T2 may be electrically coupled to a gate line to receive a scanning signal Gate, a first electrode of the second transistor T2 is electrically coupled to a data line to receive the display data signal Vdata, and a second electrode of the second transistor T2 is electrically coupled to a first node N1, that is, a gate electrode of the first transistor T1. A first electrode of the first transistor T1 is electrically coupled to the first power supply terminal V1, a second electrode of the first transistor T1 is electrically coupled to the first electrode of the third transistor 13, and the gate electrode of the first transistor T1 is electrically coupled to the first node N1. A first terminal of the storage capacitor C1 is electrically coupled to the first node N1 (i.e., between the second electrode of the second transistor T2 and the gate electrode of the first transistor T1), and a second terminal of the storage capacitor C1 is electrically coupled between the first electrode of the first transistor T1 and the first power supply terminal V1. A gate electrode of the third transistor T3 receives the control signal EM, and the second electrode of the third transistor T3 is electrically coupled to a first terminal of the light emitting device 122 (e.g., the anode of the light emitting device 122); and a second terminal of the light emitting device 122 (e.g., the cathode of the light emitting device 122) is electrically coupled to a third node N3, and the second power supply terminal V2 and the touch power supply terminal V3 are coupled to the third node N3 through the control circuit 100.

For example, the third transistor T3 and the fifth transistor T5 are of the same type. Thereby, the third transistor T3 and the fifth transistor T5 may be turned on or off simultaneously under the control of the control signal EM. For example, during the display phase, under the control of the control signal EM, the third transistor T3 and the fifth transistor T5 are simultaneously turned on, that is, the third transistor T3 connects the light emitting device 122 to the first transistor T1, and the fifth transistor T5 connects the light emitting device 122 to the second power supply terminal V2, so that the touch display panel implements the display function.

For example, FIG. 3B is a circuit diagram of a second type of a pixel unit. The pixel unit illustrated in FIG. 3B is similar to the pixel unit illustrated in FIG. 3A, but the connection mode of the third transistor T3 in the driving circuit 121 is different from that in the example illustrated in FIG. 3A. For example, the difference between the pixel unit illustrated in FIG. 3A and the pixel unit illustrated in FIG. 3B is that: in the example illustrated in FIG. 3B, the first electrode of the third transistor T3 is electrically coupled to the first power supply terminal V1, the second electrode of the third transistor T3 is electrically coupled to the first transistor T1, and the third transistor T3 is configured to control the first transistor T1 to be coupled to or decoupled from the first power supply terminal V1. During the display phase, the third transistor T3 is configured to connect the first transistor T1 to the first power supply terminal V1, to control the light emitting device 122 to emit light, so that the touch display panel may implement the display function. During the touch phase, the third transistor T3 is configured to disconnect the first transistor T1 from the first power supply terminal V1, so that the touch display panel may implement the touch function.

For example, the operation mode of the driving circuit 121 illustrated in FIG. 3B is substantially the same as the operation mode of the driving circuit 121 illustrated in FIG. 3A. For the sake of clarity, only the difference (i.e., the connections of the third transistor T3) between the example illustrated in FIG. 3B and the example illustrated in FIG. 3A is described below, and the content similar to the example illustrated in FIG. 3A is not repeated. In the example illustrated in FIG. 3B, the first electrode of the first transistor T1 is electrically coupled to a second node N2, and the second electrode of the first transistor T1 is electrically coupled to the first terminal of the light emitting device 122 (e.g., the anode of the light emitting device 122); the first electrode of the third transistor T3 may be electrically coupled to the first power supply terminal V1, and the second electrode of the third transistor T3 is electrically coupled to the second node N2 (i.e., the first electrode of the first transistor T1); and the second terminal of the storage capacitor C1 is electrically coupled to the second node N2 (i.e., the first electrode of the first transistor T1 and the second electrode of the third transistor T3).

For example, FIG. 4A is a circuit diagram of a third type of a pixel unit. In the example illustrated in FIG. 4A, the connection between the elements of the driving circuit 121 and the connection between the light emitting device 122 and the driving circuit 121 are different from those in the example illustrated in FIG. 3A. For example, for the sake of clarity, only the difference between the example illustrated in FIG. 4A and the example illustrated in FIG. 3A is described below, and the content similar to the example illustrated in FIG. 3A is not repeated.

For example, as illustrated in FIG. 4A, the gate electrode of the second transistor T2 may be electrically coupled to the gate line to receive the scanning signal Gate, the first electrode of the second transistor T2 is electrically coupled to the data line to receive the display data signal Vdata, and the second electrode of the second transistor T2 is electrically coupled to the first node N1, that is, the gate electrode of the first transistor T1. The first electrode of the first transistor T1 is electrically coupled to the second electrode of the third transistor T3, the second electrode of the first transistor T1 is electrically coupled to the first power supply terminal V1, and the gate electrode of the first transistor T1 is electrically coupled to the first node N1. The first terminal of the storage capacitor C1 is electrically coupled to the first node N1 (i.e., between the second electrode of the second transistor T2 and the gate electrode of the first transistor T1), and the second terminal of the storage capacitor C1 is electrically coupled between the second electrode of the first transistor T1 and the first power supply terminal V1. The gate electrode of the third transistor T3 receives the control signal EM, and the first electrode of the third transistor T3 is electrically coupled to the second terminal of the light emitting device 122 (e.g., the cathode of the light emitting device 122); and the first terminal of the light emitting device 122 (e.g., the anode of the light emitting device 122) is electrically coupled to a fourth node N4, and the second power supply terminal V2 and the touch power supply terminal V3 are coupled to the fourth node N4 through the control circuit 100.

For example, the operation mode of the driving circuit 121 illustrated in FIG. 4A is substantially the same as the operation mode of the driving circuit 121 illustrated in FIG. 3A, and the repeated description is omitted.

For example, FIG. 4B is a circuit diagram of a fourth type of a pixel unit. In the example illustrated in FIG. 4B, the connection between the elements of the driving circuit 121 and the connection between the light emitting device 122 and the driving circuit 121 are similar to the example illustrated in FIG. 4A, except for the connections of the third transistor T3. For the sake of clarity, only the difference (i.e., the connections of the third transistor T3) between the example illustrated in FIG. 4B and the example illustrated in FIG. 4A is described below, and the content similar to the example illustrated in FIG. 4A is not described again. For example, in the example illustrated in FIG. 4B, the second electrode of the first transistor T1 is electrically coupled to the second node N2, and the first electrode of the first transistor T1 is electrically coupled to the second terminal of the light emitting device 122 (e.g., the cathode of the light emitting device 122); the second electrode of the third transistor T3 may be electrically coupled to the first power supply terminal V1, and the first electrode of the third transistor T3 is electrically coupled to the second node N2; and the second terminal of the storage capacitor C1 is electrically coupled to the second node N2 (i.e., between the second electrode of the first transistor T1 and the first electrode of the third transistor T3).

For example, the operation mode of the driving circuit 121 illustrated in FIG. 4B is substantially the same as the operation mode of the driving circuit 121 illustrated in FIG. 3B, and the repeated description is omitted.

For example, the embodiments of the present disclosure are described by taking that the driving circuit 121 adopts the 3T1C structure as an example, but the driving circuit 121 of the embodiments of the present disclosure is not limited to the 3T1C structure. For example, the driving circuit 121 may further comprise a transfer transistor, a detection transistor, a reset transistor, etc., as required. For another example, according to actual application requirements, the driving circuit 121 may further have an electrical compensation function to compensate for threshold voltage drift of the transistor and improve display uniformity of the touch display panel. For example, the compensation function may be implemented by voltage compensation, current compensation or hybrid compensation, and may adopt an internal compensation mode or an external compensation mode. The driving circuit 121 having a compensation function may be, for example, 4T1C, 4T2C, 6T1C, and other driving circuit 121 with the electrical compensation function.

For example, as illustrated in FIG. 1B, the touch display panel further comprises a plurality of compensation sense lines 15. The plurality of compensation sense lines 15 are electrically coupled to the plurality of touch electrodes 11, correspondingly, for example, electrically coupled in one-to-one correspondence, or a plurality of touch electrodes 11 may be sensed by only one compensation sense line 15. The plurality of compensation sense lines 15 are configured to read light emission currents or light emission voltages of the plurality of touch electrodes 11 during the display phase.

In the touch display panel provided by the embodiments of the present disclosure, the touch electrode 11 which functions as the anode or the cathode of the light emitting device 122 is divided into a plurality of electrode blocks, so that the electrode voltage signals may be separately input to different light emitting devices 122, to compensate for the difference in the display voltage of the light emitting device 122 due to the IR drop, thereby improving the display image quality, and improving the display effect.

For example, a plurality of second connection holes 16 may be disposed in the insulating layer 300 (for example, the flat layer 32 and the pixel definition layer 31 illustrated in FIG. 2), each touch electrode 11 corresponds to at least one second connection hole 16, and the plurality of compensation sense lines 15 are electrically coupled to the plurality of touch electrodes 11 through the plurality of second connection holes 16.

For example, each touch electrode 11 may correspond to only one second connection hole 16 or may correspond to a plurality of second connection holes 16. The plurality of second connection holes 16 may reduce the contact resistance between the touch electrode 11 and the compensation sense line 15.

For example, as illustrated in FIG. 1B, the extending direction of the compensation sense lines 15 is the same as the extending direction of the touch detection lines 14. For example, in a case where the extending directions of the compensation sense lines 15, the touch detection lines 14, and the data lines are the same, a data driving circuit (not illustrated) and the control circuit 100 may be disposed together or integrated on one chip.

For example, the compensation sense lines 15 may be formed in the same layer as the touch detection lines 14, thereby further simplifying the manufacturing process of the touch display panel and facilitating wiring.

The compensation function of the touch display panel provided by the embodiments of the present disclosure is described in detail below with reference to FIG. 3A.

For example, as illustrated in FIG. 3A, the touch display panel further comprises a compensation circuit 17. The compensation circuit 17 comprises a difference sub-circuit and an adjustment sub-circuit. The compensation sense lines 15 may be coupled to the difference sub-circuit to transmit the sensed light emission voltages or the light emission currents of the light emitting devices 122 to the difference sub-circuit. The difference sub-circuit is configured to receive the light emission currents or the light emission voltages, and calculate differences between the light emission currents and a preset current of the light emitting device 122 or differences between the light emission voltages and a preset voltage of the light emitting device 122. The adjustment sub-circuit is configured to adjust the electrode voltage signals output by the second power supply terminal V2 according to the differences.

For example, both the difference sub-circuit and the adjustment sub-circuit may be implemented by hardware circuits. The difference sub-circuit and the adjustment sub-circuit may be formed, for example, by components such as transistors, resistors, capacitors, amplifiers, etc.

For another example, the difference sub-circuit may also be implemented by a signal processor such as a FPGA, a DSP, or a CMU. The difference sub-circuit may comprise, for example, a processor and a memory, and the processor executes a software program stored in the memory to implement the function of difference processing between the light emission currents (or the light emission voltages) and the preset current (or the preset voltage) of the light emitting device 122.

For example, in a case where the touch detection lines 14 transmit the electrode voltage signals to the touch electrodes 11, that is, during the display phase, the control circuit 100 is further configured to control the compensation sense lines 15 to read the light emission currents or the light emission voltages of the touch electrodes 11.

For example, the pixel unit further comprises a compensation control circuit 18. The compensation control circuit 18 is configured to control the compensation sense line 15 to sense the light emission current or the light emission voltage of the light emitting device 122 under the control of the control circuit 100. As illustrated in FIG. 3A, the compensation control circuit 18 may comprise a fourth transistor T4. A gate electrode of the fourth transistor T4 receives the control signal EM, a first electrode of the fourth transistor T4 is configured to be coupled to the difference sub-circuit, and a second electrode of the fourth transistor T4 is electrically coupled to the third node N3, that is, the second electrode of the fourth transistor T4 is electrically coupled to the cathode of the light emitting device 122, i.e., the touch electrode 11.

For example, as illustrated in FIGS. 3A and 5, the types of the fourth transistor T4, the third transistor T3, and the fifth transistor T5 are all the same. Thereby, the third transistor T3, the fourth transistor T4, and the fifth transistor T5 may be turned on or off simultaneously under the control of the control signal EM. For example, during the display phase, under the control of the control signal EM, the third transistor T3, the fourth transistor T4, and the fifth transistor T5 are simultaneously turned on. At this time, the light emission current or the light emission voltage of the light emitting device 122 sensed by the compensation sense line 15 may be transmitted to the difference sub-circuit in real time, and the subsequent compensation operation is performed, so that the touch display panel may implement the compensation function.

It should be noted that the compensation sense line 15 is not limited to be coupled to the position of the third node N3, and may also be coupled to other positions where the light emission current or the light emission voltage of the light emitting device 122 can be sensed.

Figure 6A:
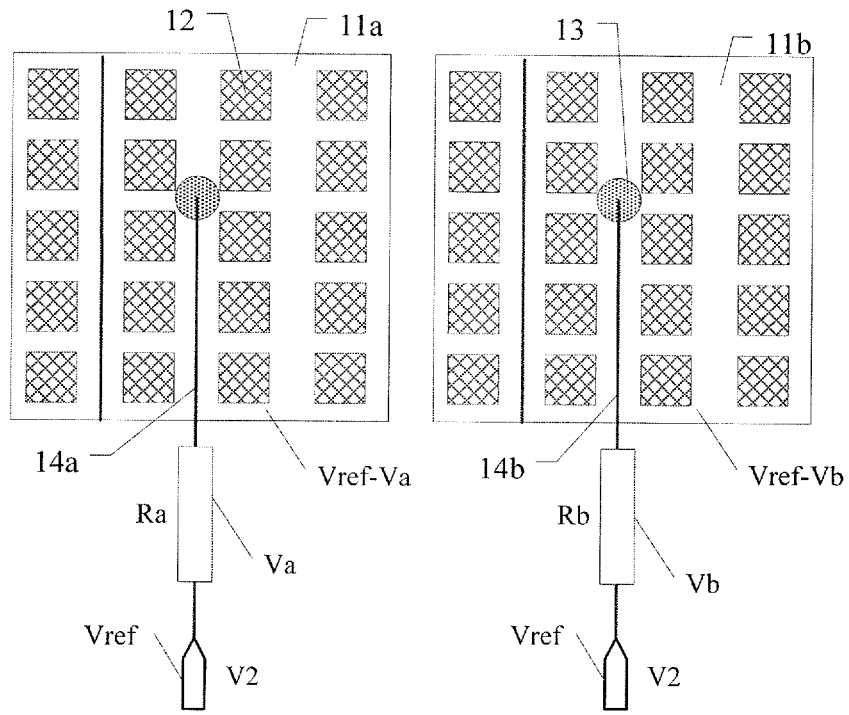
FIG. 6A is a schematic diagram of a touch display panel in an uncompensated state provided by at least one embodiment of the present disclosure.
Figure 6B:
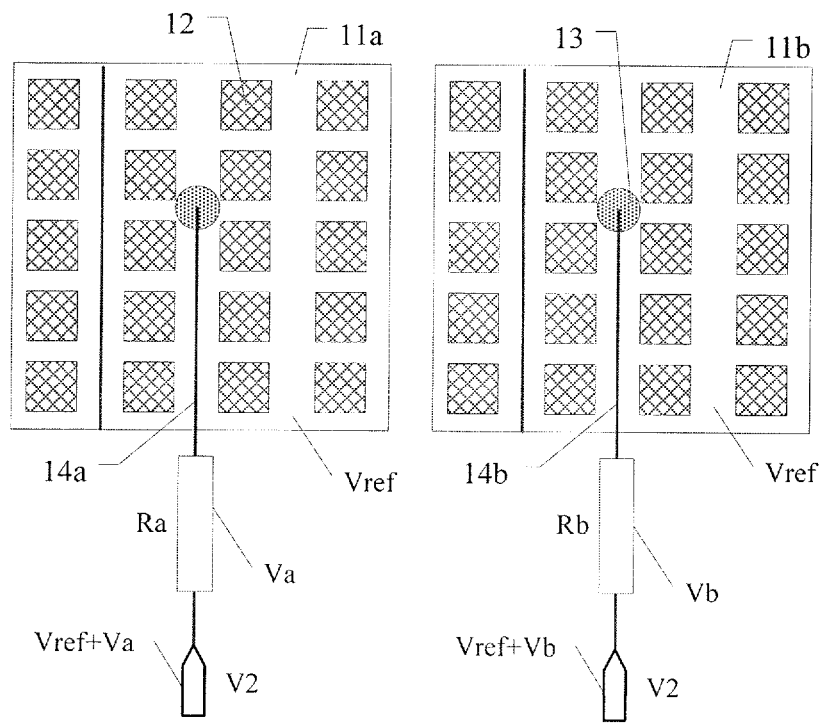
FIG. 6B is a schematic diagram of a touch display panel in a compensated state provided by at least one embodiment of the present disclosure.

FIG. 6A is a schematic diagram of a touch display panel in an uncompensated state provided by at least one embodiment of the present disclosure; and FIG. 6B is a schematic diagram of a touch display panel in a compensated state provided by at least one embodiment of the present disclosure.

For example, in a specific example, the preset voltage of the light emitting device 122 is Vref. As illustrated in FIG. 6A, the touch display panel may comprise a first touch electrode 11a, a second touch electrode 11b, a first touch detection line 14a, and a second touch detection line 14b. The line resistance of the first touch detection line 14a which is electrically coupled to the first touch electrode 11a is Ra, and the line resistance of the second touch detection line 14b which is electrically coupled to the second touch electrode 11b is Rb. Due to the IR drop, in an uncompensated state, the voltage drop on the first touch detection line 14a which is coupled to the first touch electrode 11a is Va, and the voltage drop on the second touch detection line 14b which is coupled to the second touch electrode 11b is Vb. Because the electrode voltage signals output by the second power supply terminal V2 are both Vref, the light emission voltages finally transmitted to the first touch electrode 11a and the second touch electrode 11b are Vref−Va and Vref−Vb, respectively. In a case where Va and Vb are different, different voltage drops causes nonuniform image displayed on the touch display panel.

For example, as illustrated in FIG. 6B, in a case where the compensation sense lines sense that the light emission voltages of the first touch electrode 11a and the second touch electrode 11b are Vref−Va and Vref−Vb, respectively, compensation data may be generated by the compensation circuit. For example, the compensation data may be obtained by subtracting the preset current (or the preset voltage) of the light emitting device 122 from the sensed light emission currents (or the light emission voltages). Afterwards, the electrode voltage signals output by the second power supply terminal V2 are adjusted in real time according to the compensation data. For example, the electrode voltage signal output by the second power supply terminal V2 which is electrically coupled to the first touch electrode 11a is adjusted to Vref+Va, and the electrode voltage signal output by the second power supply terminal V2 which is electrically coupled to the second touch electrode 11b is adjusted to Vref+Vb. After the voltage compensation is performed, the light emission voltages transmitted to the first touch electrode 11a and the second touch electrode 11b are both Vref and Vref, thereby improving the uniformity of the displayed image.

Figure 7:
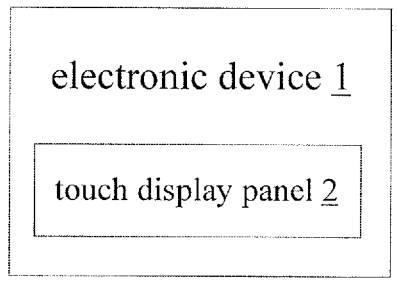
FIG. 7 is a schematic block diagram of an electronic device provided by at least one embodiment of the present disclosure.

FIG. 7 is a schematic block diagram of an electronic device provided by at least one embodiment of the present disclosure.

For example, as illustrated in FIG. 7, the electronic device comprises the touch display panel 2 provided by any one of the embodiments of the present disclosure.

For example, the touch display panel 2 may be a rectangular touch panel, a circular touch panel, an elliptical touch panel, a polygonal touch panel, etc. In addition, the touch display panel 2 may be not only a flat surface touch panel but also a curved-surface touch panel or even a spherical-surface touch panel. In a case where the touch display panel 2 is a curved-surface display panel, the touch electrodes for implementing the touch function are integrally disposed with the anode or the cathode of the light emitting device, so that the touch display panel 2 may improve the stability of the flexible display.

For example, the electronic device 1 provided by the embodiments of the present disclosure may be any product or component having a touch display function, such as a mobile phone, a tablet computer, a television, a display, a notebook computer, a digital photo frame, a navigator, etc.

It could be understood by those skilled in the art that the electronic device 1 may also include other components (for example, a control device, an image data encoding/decoding device, a line scanning driver, a column scanning driver, a clock circuit, etc.), which are not described in detail here and is not intended to limit the disclosure.

Figure 8:
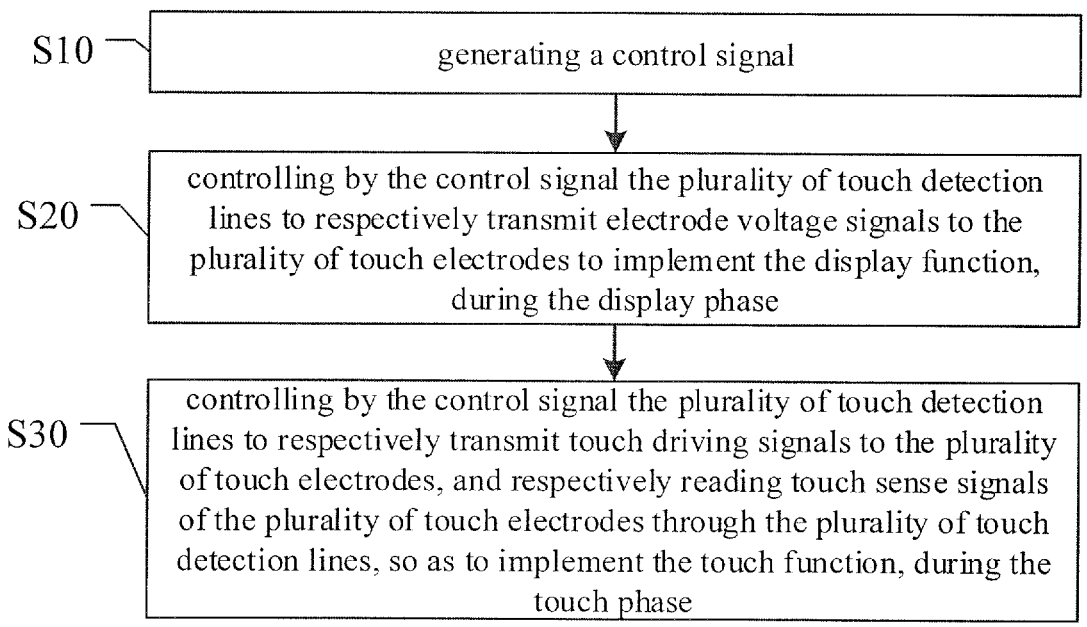
FIG. 8 is a flow chart of a method for driving a touch display panel provided by at least one embodiment of the present disclosure.

The embodiments of the present disclosure further provide a method for driving the touch display panel provided by any one of the embodiments of the present disclosure. FIG. 8 is a flow chart of a method for driving a touch display panel provided by at least one embodiment of the present disclosure.

For example, as illustrated in FIG. 8, an example of the method may comprise following operations:

S10: generating a control signal;

S20: controlling by the control signal the plurality of touch detection lines to respectively transmit electrode voltage signals to the plurality of touch electrodes to implement the display function, during the display phase; and S30: controlling by the control signal the plurality of touch detection lines to respectively transmit touch driving signals to the plurality of touch electrodes, and respectively reading touch sense signals of the plurality of touch electrodes through the plurality of touch detection lines, so as to implement the touch function, during the touch phase.

For example, during the display phase, the control signal may turn on the third transistor and the fifth transistor, while the control signal turns off the sixth transistor. Because the sixth transistor is in an off state, the touch driving signal cannot be transmitted to the touch electrode. The fifth transistor is in an on state, so the electrode voltage signal output by the second power supply terminal may be transmitted to the touch electrode (i.e., the anode or the cathode of the light emitting device) through the touch detection line. Meanwhile, because the third transistor is also in an on state, the light emission signal may be transmitted to the light emitting device. Thereby, the light emitting device emits light, and the touch display panel implements the display function.

For example, during the touch phase, the control signal turns off the third transistor and the fifth transistor, and meanwhile, the control signal turns on the sixth transistor. Because both the third transistor and the fifth transistor are in an off state, neither the light emission signal nor the electrode voltage signal can be transmitted to the light emitting diode, whereby the light emitting device does not emit light. The sixth transistor is in an on state, so the touch driving signal output by the touch power supply terminal may be transmitted to the touch electrode through the touch detection line, thereby implementing the touch function.

The above operations are not sequential, and each display phase is not required to be accompanied by a touch phase. In case of satisfying the touch time precision requirements, one touch phase may be set for every two or more display phases, thereby reducing the power consumption.

For example, the timing diagram for driving the pixel circuit may be set according to actual requirements, which is not specifically limited in the embodiments of the present disclosure.

Figure 9:
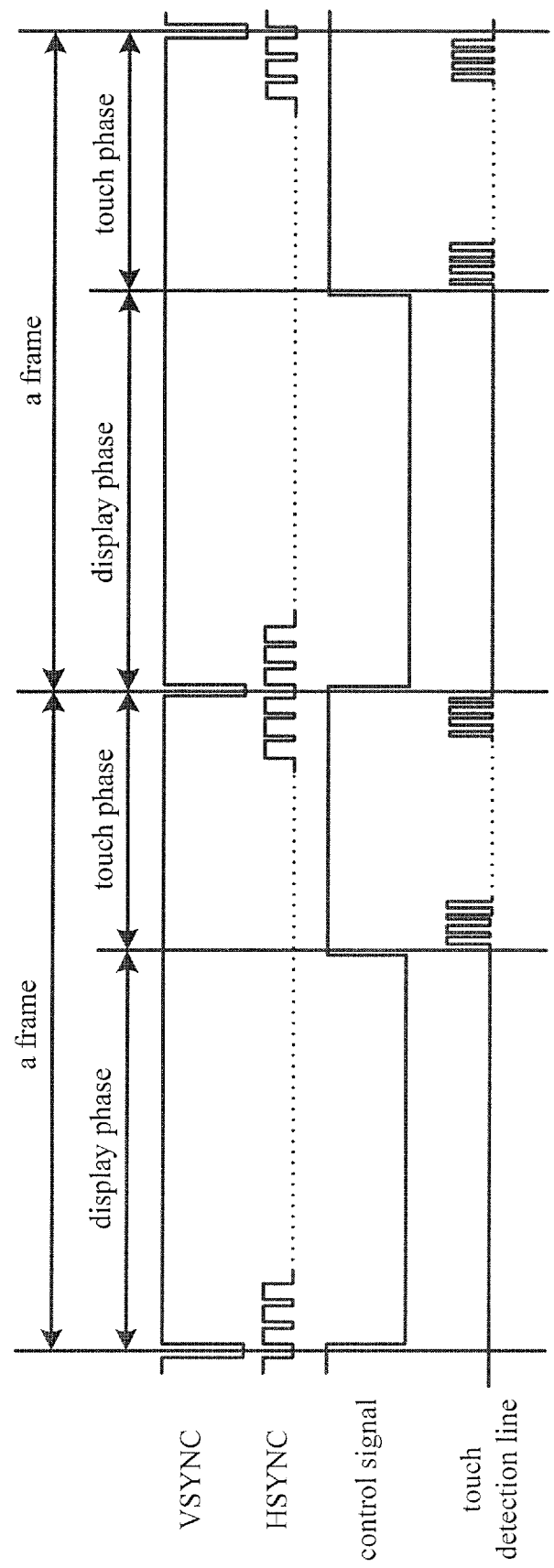
FIG. 9 is a schematic timing diagram of a method for driving a touch display panel provided by at least one embodiment of the present disclosure.

For example, FIG. 9 is a schematic timing diagram of a method for driving a touch display panel provided by at least one embodiment of the present disclosure. For example, FIG. 9 is a timing diagram of a method for driving the touch display panel comprising the pixel unit as illustrated in FIG. 3A.

For example, as illustrated in FIG. 9, the duration of the touch phase is shorter than the duration of the display phase, but the embodiments of the present disclosure are not limited thereto. For example, according to actual application requirements, the duration of the touch phase may be equal to the duration of the display phase; and the duration of the touch phase may also be equal to one-half or one-tenth of the duration of the display phase. It is not limited in the embodiments of the present disclosure.

For example, as illustrated in FIG. 9, in an example, one frame is divided into a display phase and a touch phase. In a case where the control signal is a low level signal, the touch display panel is in the display phase. At this time, the touch detection lines transmit the electrode voltage signals (for example, low level signals) to the touch electrodes, and the touch display panel implements the display function. In a case where the control signal is a high level signal, the touch display panel is in the touch phase. At this time, the touch detection lines transmit the touch driving signals (for example, pulse voltage signals) to the touch electrodes, and the touch display panel implements the touch function. In summary, under the control of the control signal, the touch display panel may transmit different signals (i.e., electrode voltage signals and touch driving signals) to the touch electrodes in a time-sharing manner, so as to respectively implement the display function and the touch function. Touch-display-integration may be implemented by time division multiplexing without any additional processes, which reduces the production cost, reduces the volume and weight of the display panel, and increases the added value of the product.

For example, as illustrated in FIG. 9, VSYNC is a field sync signal and HSYNC is a line sync signal. In a case where VSYNC is at a high level, VSYNC is valid; and in a case where HSYNC is at a high level, HSYNC is valid. During the period when VSYNC is valid, all the image data information received by the touch display panel constitutes a frame of the displayed image; and during the period when HSYNC is valid, all the image data information received by the touch display panel constitutes a line of the displayed image.

For example, in an example, the display phase may comprise a sensing phase and a compensation phase. The method further comprises following operations:

S101: controlling by the control signal a plurality of compensation sense lines to respectively read light emission voltages or light emission currents of the plurality of touch electrodes, during the sensing phase; and S102: calculating differences between the light emission voltages and a preset voltage the light emitting device or differences between the light emission currents and a preset current of the light emitting device, and adjusting the electrode voltage signals according to the differences, during the compensation phase.

For example, during the sensing phase, the control signal may turn on the fourth transistor, so the plurality of compensation sense lines may read the light emission voltages or the light emission currents of the plurality of touch electrodes, and transmit the light emission voltages or the light emission currents to the compensation circuit.

For example, during the compensation phase, the difference sub-circuit may receive the light emission voltages or the light emission currents of the light emitting diodes sensed by the plurality of compensation sense lines, and calculate differences between the light emission currents and the preset voltage of the light emitting device or differences between the light emission voltages and the preset voltage of the light emitting device; and the adjustment sub-circuit may adjust the electrode voltage signals output by the second power supply terminal according to the differences, thereby implementing the signal compensation.

For example, the display phase may further comprise a light emitting phase. During the light emitting phase, the light emitting device emits light corresponding to the display data signal according to the received display data signal.

For example, the setting mode of the sensing phase, the compensation phase, and the light emitting phase may be set according to actual application requirements, and it is not specifically limited in the embodiments of the present disclosure. For example, the sensing phase and the compensation phase may be in the time period prior to the light emitting phase. For another example, one sensing phase and one compensation phase may be set for a plurality of display phases, thereby reducing the power consumption. It should be noted that, according to actual circuit designs, the display phase may further comprise a restoration phase, a reset phase, etc.

With regard to the present disclosure, the following is to be noted:

(1) The drawings of the present disclosure only relate to the structures relevant to the embodiments of the present disclosure, and other structures may refer to the common design;

(2) For the sake of clarity, in the drawings for describing the embodiments of the present disclosure, the thickness of layers or regions is enlarged or reduced, that is, the drawings are not drawn according to actual scales; and (3) In the case of no conflict, the embodiments of the present disclosure and the features of the embodiments may be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A touch display panel, comprising: a plurality of touch detection lines, a plurality of touch electrodes, a plurality of pixel units, and an insulating layer,
   wherein the plurality of touch electrodes is in one-to-one correspondence with the plurality of touch detection lines;
   each of the plurality of touch electrodes is electrically coupled to a corresponding touch detection line of the plurality of touch detection lines through at least one connection hole in the insulating layer;
   each of the plurality of pixel units comprises a light emitting device;
   the plurality of touch electrodes is configured to implement a touch function during a touch phase;
   each of the plurality of touch electrodes is further configured to function as a cathode or an anode of the light emitting device to implement a display function during a display phase;
   each of the plurality of pixel units further comprises a driving circuit, and the driving circuit is configured to drive the light emitting device to emit light during the display phase and to control the light emitting device not to emit light during the touch phase;
   the touch display panel further comprise a substrate, and the driving circuit comprises a first transistor;
   the first transistor comprises:
   a gate electrode, on the substrate;
   a gate insulating layer, on a side of the gate electrode facing away from the substrate;
   an active layer, on a side of the gate insulating layer facing away from the substrate;
   a source electrode and a drain electrode, on the side of the gate insulating layer facing away from the substrate and overlapping with the active layer;
   the drain electrode of the first transistor is electrically coupled with the light emitting device;
   the plurality of touch detection lines is on the side of the gate insulating layer facing away from the substrate,
   the touch display panel further comprising a first power supply terminal,
   the driving circuit further comprises a third transistor,
   a first electrode of the third transistor is electrically coupled to the first transistor, a second electrode of the third transistor is electrically coupled to the light emitting device, and the third transistor is configured to control the light emitting device to be coupled to or decoupled from the first transistor,
   the touch display panel further comprises a plurality of compensation sense lines,
   the plurality of compensation sense lines is electrically coupled to the plurality of touch electrodes, correspondingly,
   the plurality of compensation sense lines is configured to read light emission currents or light emission voltages of the plurality of touch electrodes during the display phase,
   the display panel further comprises a compensation circuit and a second power supply terminal,
   the compensation circuit comprises a difference sub-circuit and an adjustment sub-circuit,
   the second power supply terminal is configured to output electrode voltage signals, and the electrode voltage signals are respectively transmitted to the plurality of touch electrodes through the plurality of touch detection lines, the difference sub-circuit is configured to receive the light emission currents or the light emission voltages, and calculate differences between the light emission currents and a preset current of the light emitting device or differences between the light emission voltages and a preset voltage of the light emitting device, the adjustment sub-circuit is configured to adjust the electrode voltage signals according to the differences, and each of the plurality of pixel units further comprises a fourth transistor, a gate electrode of the fourth transistor and a gate electrode of the third transistor are configured to receive a same control signal, a first electrode of the fourth transistor is configured to be connected to the difference sub-circuit, and a second electrode of the fourth transistor is configured to be connected to the compensation sense line, the third transistor and the fourth transistor are configured to be turned on simultaneously under control of the control signal, and phase of the control signal received by the gate electrode of the third transistor is same as phase of the control signal received by the gate electrode of the fourth transistor.

2. The touch display panel according to claim 1, further comprising a control circuit, wherein the control circuit is configured to control the plurality of touch detection lines to respectively transmit electrode voltage signals to the plurality of touch electrodes during the display phase; and the control circuit is further configured to control the plurality of touch detection lines to respectively transmit touch driving signals to the plurality of touch electrodes during the touch phase.

3. The touch display panel according to claim 2, wherein the control circuit is configured to output the control signal, in a case where the control signal has a first polarity, the plurality of touch detection lines respectively transmits the electrode voltage signals to the plurality of touch electrodes, and in a case where the control signal has a second polarity, the plurality of touch detection lines respectively transmits the touch driving signals to the plurality of touch electrodes, and the first polarity is a positive polarity and the second polarity is a negative polarity, or the first polarity is the negative polarity and the second polarity is the positive polarity.

4. The touch display panel according to claim 2, wherein the control circuit is further configured to control compensation sense lines to read light emission currents or light emission voltages of the plurality of touch electrodes when the plurality of touch detection lines respectively transmits the electrode voltage signals to the plurality of touch electrodes.

5. The touch display panel according to claim 1, wherein the light emitting device is an upward-light-emitting-type light emitting diode, and each of the plurality of touch electrodes functions as a cathode of the upward-light-emitting-type light emitting diode.

6. The touch display panel according to claim 1, wherein the light emitting device is a downward-light-emitting-type light emitting diode, and each of the plurality of touch electrodes functions as an anode of the downward-light-emitting-type light emitting diode.

7. The touch display panel according to claim 1, wherein the plurality of touch electrodes is arranged in an array, each of the plurality of touch electrodes corresponds to a pixel unit group, and the pixel unit group comprises at least one pixel unit.

8. The touch display panel according to claim 1, wherein each of the plurality of touch electrodes is rectangular.

9. The touch display panel according to claim 1, wherein the insulating layer covers the plurality of touch detection lines, and the plurality of touch electrodes are on the insulating layer.

10. The touch display panel according to claim 1, wherein the driving circuit further comprises a second transistor, and the plurality of touch detection lines is in a same layer as a gate electrode, a source electrode or a drain electrode of at least one selected from a group consisting the first transistor and the second transistor.

11. An electronic device, comprising a touch display panel, the touch display panel comprising: a plurality of touch detection lines, a plurality of touch electrodes, a plurality of pixel units, and an insulating layer, wherein the plurality of touch electrodes is in one-to-one correspondence with the plurality of touch detection lines;

each of the plurality of touch electrodes is electrically coupled to a corresponding touch detection line of the plurality of touch detection lines through at least one connection hole in the insulating layer;

each of the plurality of pixel units comprises a light emitting device;

the plurality of touch electrodes is configured to implement a touch function during a touch phase;

each of the plurality of touch electrodes is further configured to function as a cathode or an anode of the light emitting device to implement a display function during a display phase;

each of the plurality of pixel units further comprises a driving circuit, and the driving circuit is configured to drive the light emitting device to emit light during the display phase and to control the light emitting device not to emit light during the touch phase, the touch display panel further comprise a substrate, and the driving circuit comprises a first transistor;

the first transistor comprises:

a gate electrode, on the substrate;

a gate insulating layer, on a side of the gate electrode facing away from the substrate;

an active layer, on a side of the gate insulating layer facing away from the substrate; and a source electrode and a drain electrode, on the side of the gate insulating layer facing away from the substrate and overlapping with the active layer;

the drain electrode of the first transistor is electrically coupled with the light emitting device;

the plurality of touch detection lines is on the side of the gate insulating layer facing away from the substrate, the touch display panel further comprising a first power supply terminal, the driving circuit further comprises a third transistor, a first electrode of the third transistor is electrically coupled to the first transistor, a second electrode of the third transistor is electrically coupled to the light emitting device, and the third transistor is configured to control the light emitting device to be coupled to or decoupled from the first transistor, the touch display panel further comprises a plurality of compensation sense lines, the plurality of compensation sense lines is electrically coupled to the plurality of touch electrodes, correspondingly, the plurality of compensation sense lines is configured to read light emission currents or light emission voltages of the plurality of touch electrodes during the display phase, the display panel further comprises a compensation circuit and a second power supply terminal, the compensation circuit comprises a difference sub-circuit and an adjustment sub-circuit, the second power supply terminal is configured to output electrode voltage signals, and the electrode voltage signals are respectively transmitted to the plurality of touch electrodes through the plurality of touch detection lines, the difference sub-circuit is configured to receive the light emission currents or the light emission voltages, and calculate differences between the light emission currents and a preset current of the light emitting device or differences between the light emission voltages and a preset voltage of the light emitting device, the adjustment sub-circuit is configured to adjust the electrode voltage signals according to the differences, and each of the plurality of pixel units further comprises a fourth transistor, a gate electrode of the fourth transistor and a gate electrode of the third transistor are configured to receive a same control signal, a first electrode of the fourth transistor is configured to be connected to the difference sub-circuit, and a second electrode of the fourth transistor is configured to be connected to the compensation sense line, the third transistor and the fourth transistor are configured to be turned on simultaneously under control of the control signal, and phase of the control signal received by the gate electrode of the third transistor is same as phase of the control signal received by the gate electrode of the fourth transistor.

12. A method for driving a touch display panel, the touch display panel comprising: a plurality of touch detection lines, a plurality of touch electrodes, a plurality of pixel units, and an insulating layer, wherein the plurality of touch electrodes is in one-to-one correspondence with the plurality of touch detection lines;

each of the plurality of touch electrodes is electrically coupled to a corresponding touch detection line of the plurality of touch detection lines through at least one connection hole in the insulating layer;

each of the plurality of pixel units comprises a light emitting device;

the plurality of touch electrodes is configured to implement a touch function during a touch phase;

each of the plurality of touch electrodes is further configured to function as a cathode or an anode of the light emitting device to implement a display function during a display phase;

each of the plurality of pixel units further comprises a driving circuit, and the driving circuit is configured to drive the light emitting device to emit light during the display phase and to control the light emitting device not to emit light during the touch phase, the touch display panel further comprise a substrate, and the driving circuit comprises a first transistor;

the first transistor comprises:

a gate electrode, on the substrate;

a gate insulating layer, on a side of the gate electrode facing away from the substrate;

an active layer, on a side of the gate insulating layer facing away from the substrate; and a source electrode and a drain electrode, on the side of the gate insulating layer facing away from the substrate and overlapping with the active layer;

the drain electrode of the first transistor is electrically coupled with the light emitting device;

the plurality of touch detection lines is on the side of the gate insulating layer facing away from the substrate, the touch display panel further comprising a first power supply terminal, the driving circuit further comprises a third transistor, a first electrode of the third transistor is electrically coupled to the first transistor, a second electrode of the third transistor is electrically coupled to the light emitting device, and the third transistor is configured to control the light emitting device to be coupled to or decoupled from the first transistor, the touch display panel further comprises a plurality of compensation sense lines, the plurality of compensation sense lines is electrically coupled to the plurality of touch electrodes, correspondingly, the plurality of compensation sense lines is configured to read light emission currents or light emission voltages of the plurality of touch electrodes during the display phase, the display panel further comprises a compensation circuit and a second power supply terminal, the compensation circuit comprises a difference sub-circuit and an adjustment sub-circuit, the second power supply terminal is configured to output electrode voltage signals, and the electrode voltage signals are respectively transmitted to the plurality of touch electrodes through the plurality of touch detection lines, the difference sub-circuit is configured to receive the light emission currents or the light emission voltages, and calculate differences between the light emission currents and a preset current of the light emitting device or differences between the light emission voltages and a preset voltage of the light emitting device, the adjustment sub-circuit is configured to adjust the electrode voltage signals according to the differences, and each of the plurality of pixel units further comprises a fourth transistor, a gate electrode of the fourth transistor and a gate electrode of the third transistor are configured to receive a same control signal, a first electrode of the fourth transistor is configured to be connected to the difference sub-circuit, and a second electrode of the fourth transistor is configured to be connected to the compensation sense line, the third transistor and the fourth transistor are configured to be turned on simultaneously under control of the control signal, and phase of the control signal received by the gate electrode of the third transistor is same as phase of the control signal received by the gate electrode of the fourth transistor, and the method comprises:

generating the control signal;

controlling by the control signal the plurality of touch detection lines to respectively transmit electrode voltage signals to the plurality of touch electrodes to implement the display function, during the display phase; and controlling by the control signal the plurality of touch detection lines to respectively transmit touch driving signals to the plurality of touch electrodes, and respectively reading touch sense signals of the plurality of touch electrodes through the plurality of touch detection lines, so as to implement the touch function, during the touch phase.

13. The method according to claim 12, wherein the display phase comprises a sensing phase and a compensation phase, and the method further comprises:

controlling by the control signal a plurality of compensation sense lines to respectively read light emission voltages or light emission currents of the plurality of touch electrodes, during the sensing phase; and calculating differences between the light emission voltages and a preset voltage of the light emitting device or differences between the light emission currents and a preset current of the light emitting device, and adjusting the electrode voltage signals based on the differences, during the compensation phase.

* * * * *